United States Patent [19]
Jacobs et al.

[11] Patent Number: 5,822,199
[45] Date of Patent: *Oct. 13, 1998

[54] CONTROLLER FOR A POWER SWITCH AND METHOD OF OPERATION THEREOF

[75] Inventors: Mark E. Jacobs, Dallas; Vijayan J. Thottuvelil, Plano; Kenneth J. Timm, Rockwall, all of Tex.

[73] Assignee: Lucent Technologies Inc., Murray Hill, N.J.

[*] Notice: The term of this patent shall not extend beyond the expiration date of Pat. No. 5,481,219.

[21] Appl. No.: 769,285

[22] Filed: Dec. 18, 1996

[51] Int. Cl.⁶ .................................................. H02M 3/335
[52] U.S. Cl. .............................................................. 363/20
[58] Field of Search ................................ 363/15, 16, 18, 363/19, 20, 21, 95, 97, 131; 323/265, 273, 282; 327/108, 109, 420, 421, 427, 434

[56] References Cited

U.S. PATENT DOCUMENTS

| | | | |
|---|---|---|---|
| 3,986,052 | 10/1976 | Hunter | 327/109 |
| 4,178,521 | 12/1979 | Speth | 327/109 |
| 4,605,865 | 8/1986 | Yuzurihara | 327/434 |
| 4,728,826 | 3/1988 | Einzinger et al. | 307/571 |
| 4,748,351 | 5/1988 | Barzegar | 307/571 |
| 4,751,408 | 6/1988 | Rambert | 307/571 |
| 4,763,235 | 8/1988 | Morita | 363/19 |
| 5,404,059 | 4/1995 | Loffler | 327/478 |
| 5,471,376 | 11/1995 | Tsai et al. | 363/20 |
| 5,481,219 | 1/1996 | Jacobs | 327/434 |
| 5,635,867 | 6/1997 | Timm | 327/427 |

FOREIGN PATENT DOCUMENTS

| | | | |
|---|---|---|---|
| P 40 35 969.7 | 11/1990 | Germany | 17/691 |
| 4035969 A1 | 8/1991 | Germany | H03K 17/691 |

*Primary Examiner*—Matthew V. Nguyen

[57] ABSTRACT

A controller for a power switch having an isolated control terminal and coupled to a secondary winding of a drive transformer and a method of preventing spurious turn-on of the power switch. The controller includes: (1) a controllable switch, coupled between the secondary winding and the power switch, that alters a control voltage of the power switch in response to a characteristic of the secondary winding, and (2) a bias circuit coupled to the controllable switch and the power switch that provides a voltage differential between the controllable switch and the power switch to prevent spurious turn-on thereof.

20 Claims, 3 Drawing Sheets

CONTROLLER FOR A POWER SWITCH AND METHOD OF OPERATION THEREOF

TECHNICAL FIELD OF THE INVENTION

This invention relates to power electronics and, more particularly, to a controller for a power switch having an isolated control element and method of operation thereof.

BACKGROUND OF THE INVENTION

The development of high-efficiency power supplies in combination with a requirement of higher power density is a continuing goal in the field of power electronics. A power converter is a power processing circuit (or power supply) that converts an input voltage waveform into a specified output voltage waveform. The power converter generally provides a stable, well-regulated output voltage waveform. In many applications requiring a DC output, a switched-mode DC/DC converter is frequently employed. The switched-mode DC/DC converter generally includes an inverter, an input/output isolation transformer and a rectifier and filter (including a capacitor) on a secondary side of the isolation transformer. The inverter generally includes a switching device, such as a power Metal-Oxide Semiconductor Field-Effect Transistor ("MOSFET"), Insulated-Gate Bipolar Transistor ("IGBT") or a MOS-Controlled Thyristor ("MCT"), that converts the DC input voltage to an AC voltage. The input/output isolation transformer, then, transforms the AC voltage to another value and the rectifier generates the desired DC voltage at the output of the power converter. Conventionally, the rectifier includes a plurality of rectifying diodes that conduct the load current only when forward-biased in response to the input waveform to the rectifier.

One of the principal contributors to the inefficiencies associated with the switched-mode power converter is the losses associated with the turn-on and turn-off of the switching device. This is particularly true when the power converter is operated under light- or no-load conditions.

In the past, there have been attempts to reduce the losses associated with the switching devices (e.g., the power MOSFETs) by decreasing the turn-on and turn-off losses associated therewith. For instance, a number of power MOSFET gate drive schemes use an active switch between the gate and source of the power MOSFET to provide fast turn-off thereof. One type of power MOSFET gate drive scheme clamps the gate at about zero volts with respect to the source. However, this type of gate drive scheme provides a very small margin for error. Depending on the actual threshold voltage of the power MOSFET, a fluctuation in the gate-source voltage (e.g., only 1.5 volts) thereacross (induced by noise or parasitic elements in the circuit) may cause spurious turn-ons of the power MOSFET.

The noise susceptibility in the power MOSFET gate drive circuits become increasingly troublesome as the switching speed of the power MOSFET and power level of the switched-mode power converter increase. The noise susceptibility is magnified when the power MOSFET is employed with an isolating gate-drive transformer. High current switching paths and parasitic couplings superimpose spurious spikes into the gate drive circuits. Under certain conditions, noise voltage pulses in the gate drive circuit (depending on the polarity and amplitude) may induce the power MOSFET to turn on at inappropriate times. Turning on the power MOSFET at an inappropriate time may lead to a catastrophic failure in the switched-mode power converter.

Accordingly, what is needed in the art is a controller for a switching device having an isolated control terminal that substantially reduces inadvertent turn-on of the switching device.

SUMMARY OF THE INVENTION

To address the above-discussed deficiencies of the prior art, the present invention provides a controller for a power switch having an isolated control terminal and coupled to a secondary winding of a drive transformer and a method of preventing spurious turn-on of the power switch. The controller includes: (1) a controllable switch, coupled between the secondary winding and the power switch, that alters a control voltage of the power switch in response to a characteristic of the secondary winding, and (2) a bias circuit coupled to the controllable switch and the power switch that provides a voltage differential between the controllable switch and the power switch to prevent spurious turn-on thereof.

The present invention therefore introduces the broad concept of providing a bias to a controller for a power switch having an isolated control terminal (e.g., a capacitively-coupled control terminal such as a gate terminal of a MOSFET or IGBT) during the off time of the power switch to enhance its immunity to inadvertent turn-on. The bias is generated by a self-contained, passive network that may be floated at any potential with respect to ground. This bias is automatically generated through the action of the network to the control waveform, eliminating the need for an external bias supply to provide this voltage. Each bias supply is arranged locally, thus eliminating the need for long interconnects that may interfere with circuit operation. The bias network in one implementation includes a combination of a capacitor, resistor and non-linear semiconductor device with a fixed voltage breakdown characteristic. This implementation maintains the capability of producing systems with high packaging densities.

In an alternative embodiment of the present invention, the power switch is a power Metal-Oxide Semiconductor Field-Effect Transistor ("MOSFET") switch. Gate and source electrodes of the power MOSFET switch are coupled to the secondary winding and the controllable switch has power electrodes coupled therebetween. The controllable switch is capable of altering a gate-source voltage of the power MOSFET switch to prevent spurious turn-on thereof. Of course, the power switch may include, without limitation, an IGBT or a MCT, but the broad scope of the present invention is not so limited. The controllable switch may also be a MOSFET switch, but any number of well-known controllable switches are also acceptable.

In an alternative embodiment of the present invention, the control voltage is of a negative polarity and is a function of a defined breakdown voltage of a zener diode in the bias circuit.

In an alternative embodiment of the present invention, the characteristic is voltage across the secondary winding. The characteristic of the secondary winding may also include a current or any other suitable characteristic.

In an alternative embodiment of the present invention, the controller includes a diode and a resistor coupled in parallel to affect a turn-on and turn-off of the power switch. In a related but alternative embodiment, the controller includes another parallel-coupled diode and resistor combination to affect a turn-on and turn-off of said controllable switch.

In an alternative embodiment of the present invention, the power switch is employed in a power supply. Those skilled in the art will perceive other applications for the circuit and method of the present invention apart from their utility in power supplies.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
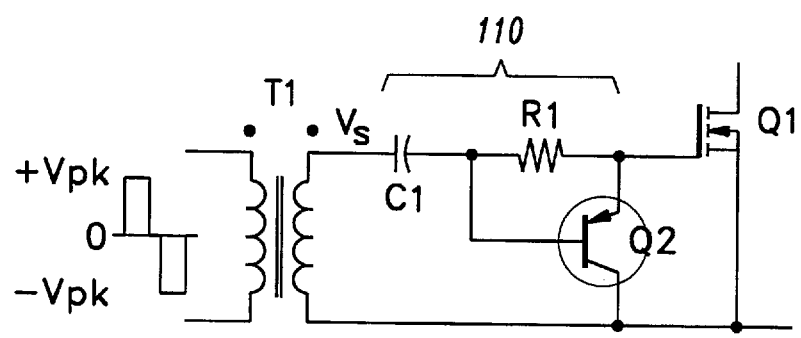
FIG. 1 illustrates a schematic diagram of a prior art controller employing a transistor.

Referring initially to FIG. 1, illustrated is a schematic diagram of a prior art controller 110 employing a transistor Q2. The controller 110 drives a power MOSFET Q1 and employs the transistor (e.g., bipolar transistor) Q2 to clamp the gate of the power MOSFET Q1 at a source voltage $V_S$ provided by the secondary winding of a drive transformer T1. The controller 110 is susceptible to ringing when the gate of the power MOSFET Q1 is clamped. As a result of the ringing, the power MOSFET Q1 is susceptible to spurious turn-on. The prior art did not make accommodations to counteract the ringing that, ultimately, may lead to a failure of the circuit employing the power MOSFET Q1 to advantage.

One of the problems associated with employing a bipolar transistor is that a significant driver is necessary to accommodate the base drive current for the transistor Q2. While the present embodiment illustrates one power MOSFET Q1, a circuit employing the controller 110 may include several power MOSFET devices coupled in parallel. The input capacitances associated with a number of parallel-coupled power MOSFET devices may be considerable. Under the circumstances, the thermal considerations of the transistor Q2 should be addressed and, in extreme situations, heat sinking may be necessary to avoid overheating the transistor Q2.

Additionally, when fast turn-off is required for the power MOSFET Q1, a substantial amount of current is drawn by the transistor Q2 to discharge the input gate-source capacitance of the power MOSFET Q1. The substantial current (being collector current) of the transistor Q2 leads to a substantial base current to support the collector current. With a substantial collector current, the gain of the bipolar transistor drops-off accordingly. The reduction in the gain in combination with an increased collector current requires additional base current supplied from the drive generator on the primary side of the drive transformer T1. The situation is compounded when a faster switching time of the power MOSFET Q1 is required or as the switching frequency is increased. As a result, the drive signal requires a larger power handling capability leading to inefficiencies in the circuit, added circuit complexities, additional circuit stresses and induced noise resulting from the larger input currents. These effects are obviously undesirable and should be avoided. Failure to provide adequate drive current translates into lower than expected switching speeds and increased dissipation in the transistor Q2 resulting from being pulled out of saturation. Again, the substantial base current must flow through the leakage inductance of the transformer T1 and the rise time thereof is limited by circuit constraints. The effect is aggravated by an increased base current demand or by increasing the speed of operation.

In conjunction therewith, the value of a resistor R1 should be selected carefully. If the value of the resistor R1 is too low, the series resonant circuit formed by the leakage inductance of the transformer T1 and the input capacitance of the power MOSFET Q1 rings. Consequently, the turn-on bias may be insufficient and the transistor Q2 will not receive enough base-emitter voltage to activate the transistor Q2 during the turn-off period of the power MOSFET Q1. Conversely, if the value of the resistor R1 is too large, the forward charging current into the input capacitance of the power MOSFET Q1 may result in an excessive base-emitter reverse bias and cause damage to the power MOSFET Q1 by over stressing the reverse biased junction thereof. To overcome the shortcomings as mentioned above, the transistor Q2 must be a relatively large device to accommodate the large peak currents without undue stress.

Figure 2:
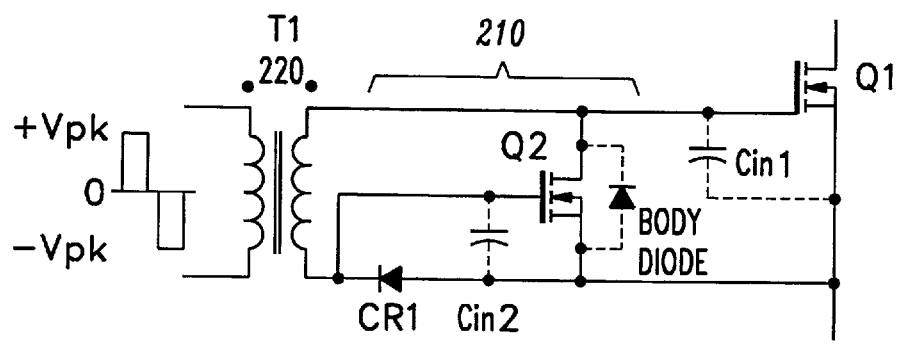
FIG. 2 illustrates a schematic diagram of a prior art controller employing a MOSFET.

Turning now to FIG. 2, illustrated is a schematic diagram of an embodiment of a prior art controller 210 employing a MOSFET Q2. The controller (e.g., a gate driver) 210 drives a power MOSFET Q1 and employs the MOSFET Q2 to clamp the gate of the power MOSFET Q1 to zero volts without a negative bias. The drive signal applied to a drive transformer T1 is a rectangular, bipolar waveform, and has an amplitude of typically 12 to 15 V. The signal is typically derived from a low impedance source (e.g., totem-pole connected MOSFETs). To maintain low impedance, it is desirable to have a tight coupling between the primary and secondary circuits.

The drive waveform can be divided into three distinct regions. A first region has a positive polarity with a positive voltage amplitude +Vpk corresponding to the power MOSFET Q1 being on. A second region has a negative polarity with a negative voltage amplitude −Vpk corresponding to the power MOSFET Q1 being off and the gate-source impedance held low. A third region has a zero amplitude or dead-time and occurs in a transitional period between the first and second regions. The power MOSFET Q1 must be off during the second and third regions. When power MOSFETs are employed in a half or full-bridge power converter topology, the dead-time is added, for instance, to ensure that a simultaneous (overlapping) conduction between the upper (high-side) power MOSFET(s) and lower (low-side) power MOSFET(s) does not occur.

Many operational advantages result by employing a controllable switch such as the MOSFET Q2, namely, high transconductance ("gm") for all operational conditions, minimal gate current and a minimum load imposed on the controller 210. The MOSFET Q2, therefore, is able to support large drain currents without incurring the base current load penalty imposed by bipolar transistor devices.

The controller 210 generally operates as follows. During the first region of operation, a positive voltage is applied at the dotted end 220 of the transformer T1 thereby inducing a pulse of current to flow in a gate circuit loop. The gate circuit loop includes a secondary winding of transformer T1, gate input capacitance Cin1 of the power MOSFET Q1 and diode CR1. The gate input capacitance Cin1 is charged to the positive voltage amplitude +Vpk thereby turning the power MOSFET Q1 on when the gate threshold voltage is reached. During this period of operation, the MOSFET Q2 is effectively out of the circuit.

During the second region of operation, the dotted end 220 of the transformer T1 is negative and, for reasons hereinafter described, the MOSFET Q2 is turned on. A positive tap of the transformer T1 is coupled to the gate of the MOSFET Q2 and a negative tap of the transformer T1 is coupled to the drain of the MOSFET Q2. Since a body diode of the MOSFET Q2 does not block a negative drain voltage thereof, the MOSFET Q2 conducts. Therefore, a substantial portion of the transformer T1 voltage appears across the gate-source terminals of the MOSFET Q2 (or across the reversed biased diode CR1) with a proper polarity to drive the MOSFET Q2 on. As a result, a low impedance state is maintained between the gate and source terminals of the power MOSFET Q1 throughout the negative voltage period of the transformer T1.

Finally, during the dead-time interval (e.g., 100 ns), the power MOSFET Q1 is off and the gate input capacitance Cin1 is initially charged to the positive voltage amplitude +Vpk. When the voltage of the secondary winding of the transformer T1 drops to zero (corresponding to the beginning of the dead-time interval), the voltage exhibited at the gate input capacitance Cin1 is transferred with little change to the gate input capacitance Cin2 associated with the MOSFET Q2. The gate input capacitance Cin1 is designed to be greater than the gate input capacitance Cin2 (by the relative die sizes of the power MOSFET Q1 and the MOSFET Q2); while the charge is shared between the two capacitances Cin1, Cin2, the voltage droop is minimal, thereby providing an environment where the MOSFET Q2 turns on rapidly. Since the discharge path of the MOSFET Q2 bypasses the leakage reactance of transformer T1, the gate voltage of the power MOSFET Q1 declines rapidly.

Figure 3:
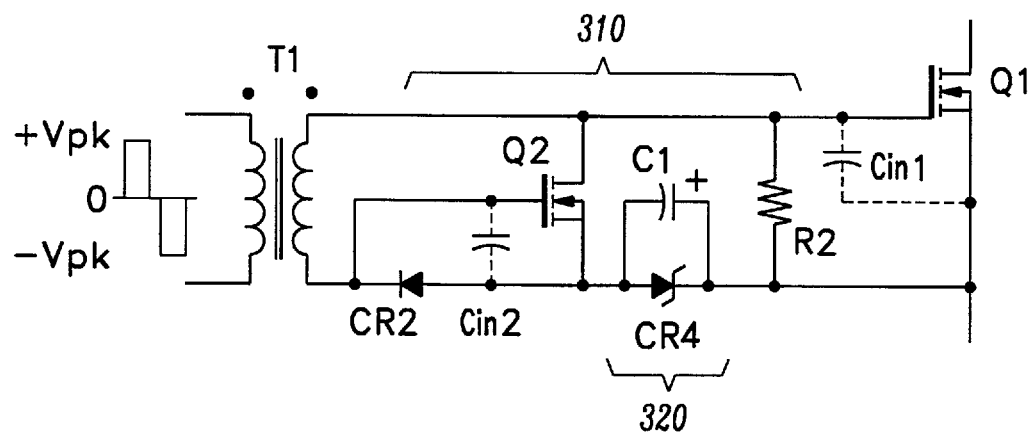
FIG. 3 illustrates a schematic diagram of an embodiment of a controller for a power MOSFET switch constructed according to the principles of the present invention.

Turning now to FIG. 3, illustrated is a schematic diagram of an embodiment of a controller 310 for a power MOSFET switch (or power MOSFET) Q1 constructed according to the principles of the present invention. While the power switch is a power MOSFET in the present embodiment, other power switching devices having an isolated control terminal are well within the broad scope of the present invention. The controller (e.g., a gate driver) 310 for the power MOSFET Q1 is coupled to a secondary winding of a drive transformer T1. The controller 310 includes (1) a controllable switch (e.g., a drive MOSFET Q2), coupled between the secondary winding and the power MOSFET Q1, that alters a control voltage (e.g., gate-source voltage) of the power MOSFET Q1 in response to a characteristic (e.g., a voltage) of the secondary winding and (2) a bias circuit 320 coupled to the drive MOSFET Q2 and the power MOSFET Q1 that provides a voltage differential between the drive MOSFET Q2 and the power MOSFET Q1 to prevent spurious turn-on thereof.

The bias circuit 320, in the present embodiment, includes a nonlinear breakdown diode (e.g., a zener diode) CR4, capacitor C1 and resistor R2. The resistor R2 provides a current path, beyond that of the gate input capacitance Cin1 path of the power MOSFET Q1, to charge the capacitor C1 to the regulating voltage of the zener diode CR4. By employing the bias circuit 320, a negative DC voltage (e.g., a few volts) is applied between the gate and source of the power MOSFET Q1 thereby providing an additional degree of protection against inadvertent turn-on thereof (assuming an N-channel power MOSFET Q1). Under these circumstances, a noise spike would have to attain the sum of the gate-source threshold voltage of the power MOSFET Q1 and the magnitude of the negative bias created by the bias circuit 320 before the power MOSFET Q1 is commutated on. The negative bias provides a substantial degree of protection not present by merely attempting to hold the gate at zero volts.

Figure 4:
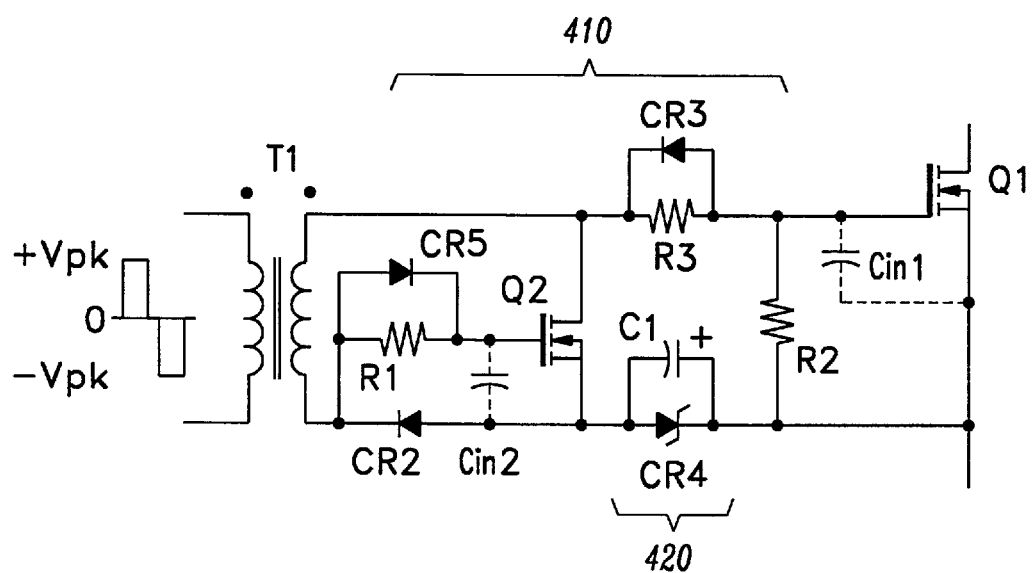
FIG. 4 illustrates a schematic diagram of another embodiment of a controller for a power MOSFET switch constructed according to the principles of the present invention.

Turning now to FIG. 4, illustrated is a schematic diagram of another embodiment of a controller 410 for a power MOSFET Q1 constructed according to the principles of the present invention. Analogous to the controller 310 of FIG. 3, the controller (e.g., gate driver) 410 includes a drive MOSFET Q2, coupled between a secondary winding of a drive transformer T1 and the power MOSFET Q1, and a bias circuit 420 coupled to the drive MOSFET Q2 and the power MOSFET Q1. The controller 410 also includes a parallel-coupled diode CR3 and resistor R3 combination that affects a turn-on and turn-off of the power MOSFET Q1. The controller 410 also includes a second parallel-coupled diode CR5 and resistor R1 combination that affects a turn-on and turn-off of the drive MOSFET Q1. In either case, the resistor R1, R3 damps a gate ringing of the drive MOSFET Q2 and power MOSFET Q1, respectively, at turn-on. Additionally, the diode CR5, CR3 provides a low impedance path to the gate of the drive MOSFET Q2 and power MOSFET Q1, respectively, to enhance a rapid turn-off thereof.

Regarding the bias circuit 420, the circuit is active during a first region of operation (i.e., when the dotted end of the transformer T1 is positive). A loop current flows through the dotted end of the transformer T1, the resistor R3, the gate input capacitance Cin1 of the power MOSFET Q1, the diodes CR4, CR2 and back into the transformer T1; the diode CR4 is induced to clamp at its reference voltage. The capacitor C1 is charged to the reference voltage of the diode CR4 simultaneously. In the absence of the resistor R2, the loop current flows only until the gate input capacitance Cin1 of the power MOSFET Q1 is charged to the positive voltage amplitude +Vpk and then ceases. As a result, there may be insufficient current to charge the capacitor C1 to the voltage of the diode CR4 and an inadequate bias potential is generated. In fact, the diode CR4 may not conduct at all if the current flowing through the capacitor C1 does not provide an adequate voltage rise thereacross. The resistor R2, thus, supplies a supplemental current path for the bias circuit 420. As long as the polarity of the transformer T1 is positive, the loop current flows for the entire on period. The on period in a zero-voltage switching phase-shifted bridge circuit, for instance, is constant at about one half of the switching frequency and thus provides substantial time to permit charging of the bias circuit 420. This does not mean that variable on time periods cannot be accommodated, but a proper selection of the components is necessary. The value of capacitor C1 should be selected such that when its charge is shared with the input gate capacitance Cin1 of the power MOSFET Q1 during the off time (i.e., when the drive MOSFET Q2 is on) the resultant voltage is not unduly diminished. If the value of capacitor C1 is equal to the input gate capacitance Cin1 of the power MOSFET Q1, for instance, the resultant negative bias will become about half of the reference voltage of the diode CR4. If an inadequate negative bias potential is provided, then the value of the capacitor C1 should be increased accordingly.

More specifically with reference to the parallel-coupled diode CR3 and resistor R3 combination, the resistor R3 controls the speed of the turn-on of the power MOSFET Q1 as determined by a time constant product of the resistor R3 and input gate capacitance Cin1 of the power MOSFET Q1. Controlling the rate of current rise through the power MOSFET Q1 is often beneficial from the perspective of electromagnetic interference. The resistor R3 is also used to suppress a voltage ringing in the gate series resonant circuit formed by the leakage inductance of the transformer T1 and the gate input capacitance Cin1 of the power MOSFET Q1. The rate of turning the power MOSFET Q1 off is also important. While the power MOSFET Q1 is on, the drain-source voltage and drain-source capacitance are minimal. Turning the power MOSFET Q1 off rapidly allows the drain current to be diverted into the drain-source capacitance before any significant voltage can be built up. As a result, an effective lossless switching action is achieved. The diode CR3 provides a low impedance path to expedite the turn-off process while allowing the resistor R3 to provide controlled turn-on. Preferably, the diode CR3 should be a Schottky barrier diode for maximum speed and minimum forward voltage drop. Of course, the scope of the invention is not so limited.

More specifically with reference to the second parallel-coupled diode CR5 and resistor R4 combination, consider the dead-time interval or dead band period when the secondary winding of the drive transformer T1 is zero and the gate input capacitance Cin1 of the power MOSFET Q1 is initially equal to the positive voltage amplitude +Vpk. The charge initially on the gate input capacitance Cin1 of the power MOSFET Q1 is now shared with the gate input capacitance Cin2 of the drive MOSFET Q2. Since the gate input capacitance Cin1 of the power MOSFET Q1 is larger than the gate input capacitance Cin2 of the drive MOSFET Q2, a relatively small voltage decrement is provoked. When the drive MOSFET Q2 is turned on, its gate input capacitance Cin2 discharges to turn the power MOSFET Q1 off. The voltage across the gate input capacitance Cin1 of the power MOSFET Q1, however, is substantially the same as the voltage appearing across the gate input capacitance Cin2 of the drive MOSFET Q2 (which is equivalent to the gate voltage of the discharge MOSFET). Thus, the drive MOSFET Q2 is discharging its own source of turn-on bias. A situation ultimately develops where the voltage across the gate input capacitance Cin2 of the drive MOSFET Q2 (equivalent to the gate input capacitance Cin1 of the power MOSFET Q1) is insufficient to maintain the drive MOSFET Q2 active. The voltage across the gate input capacitance Cin2 of the drive MOSFET Q2 is really the gate-source threshold voltage of the drive MOSFET Q2. Thus, with the gate input capacitances Cin1, Cin2 discharged down to the gate-source threshold voltage of the drive MOSFET Q2, the discharging action ceases. It is preferable at this point that the power MOSFET Q1 is off. It is highly desirable to assure that the gate-source threshold voltage of the power MOSFET Q1 is larger than the gate-source threshold voltage of the drive MOSFET Q2; the condition may be so arranged by a judicious component selection or using logic level MOSFETs for the drive MOSFET Q2. However, there are other more advantageous techniques to manage the aforementioned problem including the use of the second parallel-coupled diode CR5 and resistor R4 combination.

The gate input capacitance Cin2 of the drive MOSFET Q2 charges rapidly from the gate input capacitance Cin1 of the power MOSFET Q1 at the beginning of the dead band period thereby allowing the drive MOSFET Q2 to turn-on solidly. As the gate input capacitance Cin1 of the power MOSFET Q1 discharges due to the drain current conducted by the drive MOSFET Q2, the gate input capacitance Cin2 of the drive MOSFET Q2 maintains much of its charge. The fast charging diode CR5 becomes reverse biased (as long as the voltage across the gate input capacitance Cin2 of the drive MOSFET Q2 is larger than that of the gate input capacitance Cin1 of the power MOSFET Q1) and slowly discharges through the resistor R4. The circuit supplies energy storage such that the drive MOSFET Q2 will continue to conduct or be in the on state throughout the dead band period. Using a Schottky diode for the diode CR5 results in a lower forward voltage drop and lower voltage loss for the gate of the drive MOSFET Q2. The value of the resistor R4 is a compromise between eliminating the ringing in the gate input capacitance Cin2 of the drive MOSFET Q2 and leakage inductance circuit of the transformer T1, and the time constant being of a period such that the drive MOSFET Q2 remains on when the transformer T1 goes forward biased once again. The latter condition results in a short circuit across the secondary winding (somewhat limited by the leakage inductance) of the transformer T1. A current spike may occur if the time constant relating to the resistor R4 and gate input capacitance Cin2 of the drive MOSFET Q2 is extended beyond an acceptable period.

Returning now to the operation of the controller 410, the controller 410 generally operates as follows. When a current flows in a loop including a secondary winding of the transformer T1, second resistor R3, gate input capacitance Cin1, capacitor C1 and diode CR2, a voltage is set up across the capacitor C1 equal to the voltage of the zener diode CR4. Additionally, the charge on the capacitor C1 is refreshed at the gate switching rate of the power MOSFET Q1 and, if the capacitor C1 is large enough, only a small voltage droop (caused by a charge redistribution between the capacitor C1 and the other capacitances in the circuit) results. When the polarity at dotted end of the transformer T1 is negative, the drive MOSFET Q2 will turn on, providing a low impedance between the bias circuit 420 and the gate of the power MOSFET Q1. Thus, the gate-source voltage of the power MOSFET Q1 is negative and approximately equal to the bias present on the capacitor C1 (set by the zener diode CR4) of the bias circuit 420. Otherwise, the controller 410 operates analogously to the controller 310 of FIG. 3 with the addition of the parallel-coupled diode-resistor (CR3-R3, CR5-R1) combinations as described above.

Of course, those skilled in the art should understand that the previously described embodiments of the controller were submitted for illustrative purposes only, and other embodiments capable of preventing spurious turn-on of a power switch are well within the broad scope of the present invention.

Figure 5A:
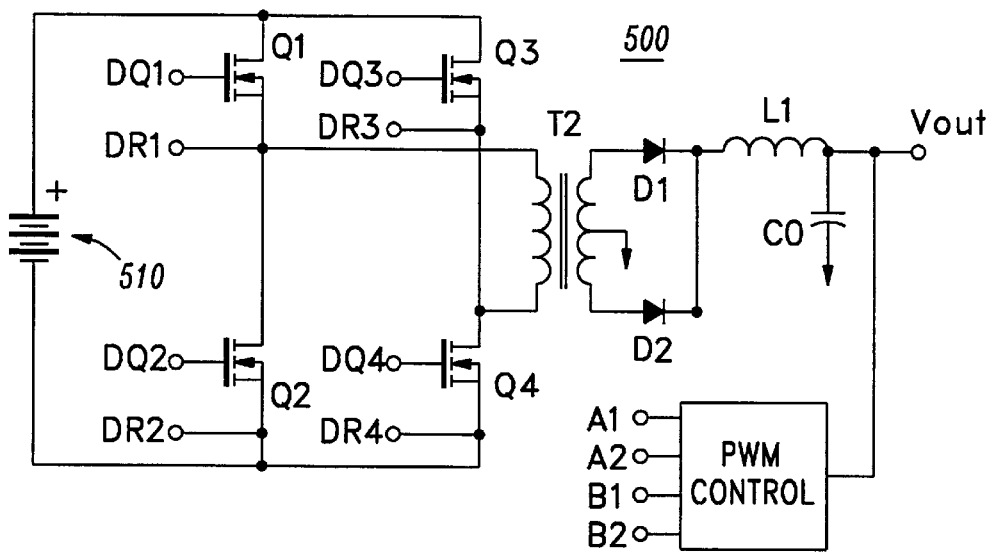
FIGS. 5A, 5B, 5C illustrate an embodiment of a power supply employing multiple controllers as illustrated and described with respect to FIG. 3.
Figure 5B:
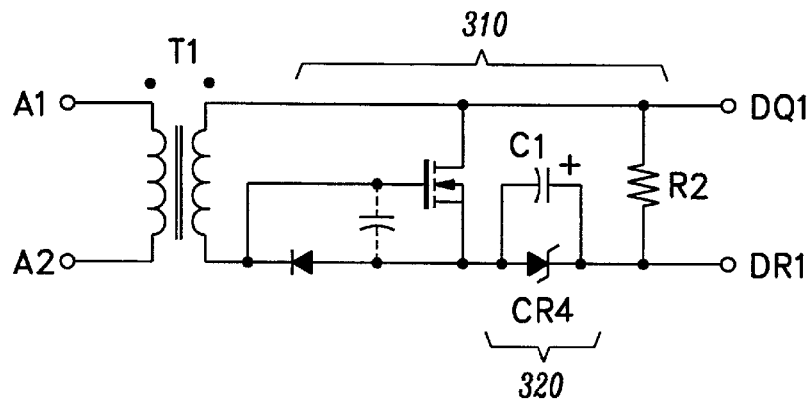
Figure 5C:
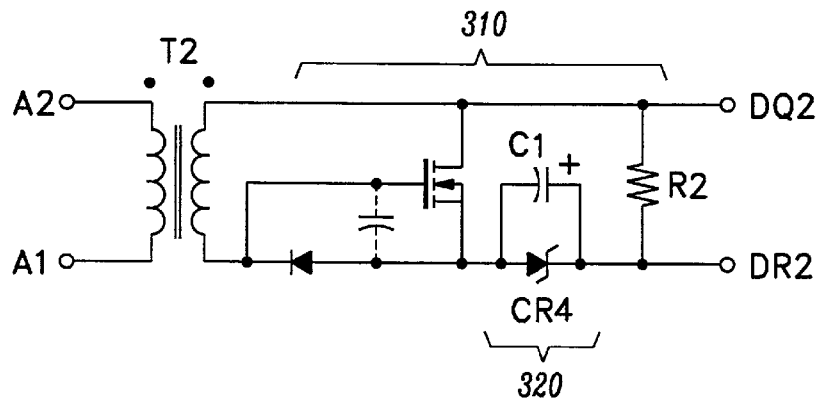

Turning now to FIGS. 5A, 5B, 5C illustrated is an embodiment of a power supply 500 employing multiple controllers 310 as illustrated and described with respect to FIG. 3. As described with respect to FIG. 3, each of the controllers 310 include the drive MOSFET Q2 and the bias circuit 320 including the zener diode CR4, capacitor C1 and resistor R2. For a better understanding of the operation of the controller 310, see the discussion with respect to FIG. 3.

The power supply 500 includes a source of electrical power 510, a power train (including power MOSFETs Q1, Q2, Q3, Q4), an isolation transformer T2, a rectifier (including a pair of diodes D1, D2), an output filter circuit (including an inductor L1 and capacitor C0), a control circuitry [including a pulse-width modulator ("PWM") Control] and the controller 310 (as illustrated in FIGS. 5B, 5C). The power supply 500 is generally known as a phase-shifted bridge power converter. Of course, other power supply or converter topologies are well within the broad scope of the present invention. In the illustrated embodiment, control signals A1, A2 are fed to the controllers 310 of FIGS. 5B, 5C including the drive transformer T1 and bias circuit 320. The outputs DQ1, DR1, DQ2, DR2 of the controllers 310 are fed to the power MOSFETS Q1, Q2, respectively. Those skilled in the art should understand that an additional pair of controllers (similar to the controllers illustrated in FIGS. 5B, 5C) may be employed to control the power MOSFETs Q3, Q4. For a better understanding of power electronics and power converter topologies, such as the phase-shifted bridge power converter, see *Unitrode Product and Applications Handbook,* by the Unitrode Corporation of Merrimack, N.H., (1995/1996). The aforementioned reference is herein incorporated by reference.

Although the present invention has been described in detail, those skilled in the art should understand that they can make various changes, substitutions and alterations herein without departing from the spirit and scope of the invention in its broadest form.

What is claimed is:

1. A controller for a power switch having an isolated control terminal and coupled to a secondary winding of a drive transformer, said controller comprising:

a controllable switch, coupled between said secondary winding and said power switch, that alters a control voltage of said power switch in response to a characteristic of said secondary winding; and a bias circuit, coupled to said controllable switch and said power switch, having a parallel-coupled zener diode operating as a nonlinear semiconductor breakdown device and capacitor, said bias circuit providing a voltage differential between said controllable switch and said power switch to prevent spurious turn-on of said power switch.

2. The controller as recited in claim 1 wherein said power switch is a power Metal-Oxide Semiconductor Field-Effect Transistor (MOSFET) switch, gate and source electrodes of said power MOSFET switch are coupled to said secondary winding and said controllable switch has power electrodes coupled therebetween, said controllable switch capable of altering a gate-source voltage of said power MOSFET switch to prevent spurious turn-on thereof.

3. The controller as recited in claim 1 wherein said control voltage is of a negative polarity and is a function of a defined breakdown voltage of said zener diode in said bias circuit.

4. The controller as recited in claim 1 wherein said characteristic comprises a voltage across said secondary winding.

5. The controller as recited in claim 1 wherein said bias circuit comprises a resistor coupled between said control terminal and another terminal of said power switch.

6. The controller as recited in claim 1 further comprising a diode and a resistor coupled in parallel to affect a turn-on and turn-off of said power switch.

7. The controller as recited in claim 1 further comprising a diode and a resistor coupled in parallel to affect a turn-on and turn-off of said controllable switch.

8. For use with a power switch having an isolated control terminal and coupled to a secondary winding of a drive transformer, a method of preventing spurious turn-on of said power switch, comprising the steps of:

altering a control voltage of said power switch with a controllable switch in response to a characteristic of said secondary winding; and providing a voltage differential between said controllable switch and said power switch with a bias circuit, coupled to said controllable switch and said power switch, having a parallel-coupled zener diode operating as a nonlinear semiconductor breakdown device and capacitor.

9. The method as recited in claim 8 wherein said power switch is a power Metal-Oxide Semiconductor Field-Effect Transistor (MOSFET) switch, gate and source electrodes of said power MOSFET switch are coupled to said secondary winding and said controllable switch has power electrodes coupled therebetween, the step of altering comprises the step altering a gate-source voltage of said power MOSFET switch with said controllable switch to prevent spurious turn-on thereof.

10. The method as recited in claim 8 wherein said control voltage is of a negative polarity and is a function of a defined breakdown voltage of said zener diode in said bias circuit.

11. The method as recited in claim 8 wherein said characteristic comprises a voltage across said secondary winding.

12. The method as recited in claim 8 wherein said bias circuit comprises a resistor coupled between said control terminal and another terminal of said power switch.

13. The method as recited in claim 8 further comprising the step of affecting a turn-on and turn-off of said power switch with a diode and a resistor coupled in parallel.

14. The method as recited in claim 8 further comprising the step of affecting a turn-on and turn-off of said controllable switch with a diode and a resistor coupled in parallel.

15. A power supply, comprising:

a power train having a power train input couplable to a source of electrical power and a power train DC output couplable to an electrical load, said power train including:

an isolation transformer having a primary winding and a secondary winding, a power switch coupled to said primary winding and having an isolated control terminal, a rectifier coupled to said secondary winding, and an output filter coupled to said rectifier; and control circuitry for applying control signals to a power train, said control circuitry having a controller for said power switch, said controller including:

a controllable switch, coupled between a secondary winding of a drive transformer and said power switch, that alters a control voltage of said power switch in response to a characteristic of said secondary winding; and a bias circuit coupled to said controllable switch and said power switch and including a zener diode operating as a nonlinear semiconductor breakdown device, a capacitor and a resistor, said circuit providing a voltage differential between said controllable switch and said power switch to prevent spurious turn-on thereof.

16. The power supply as recited in claim 15 wherein said power switch is a power Metal-Oxide Semiconductor Field-Effect Transistor (MOSFET) switch, gate and source electrodes of said power MOSFET switch are coupled to said secondary winding of said drive transformer and said controllable switch has power electrodes coupled therebetween, said controllable switch capable of altering a gate-source voltage of said power MOSFET switch to prevent spurious turn-on thereof.

17. The power supply as recited in claim 15 wherein said control voltage is of a negative polarity and is a function of a defined breakdown voltage of said zener diode.

18. The power supply as recited in claim 15 wherein said characteristic comprises a voltage across said secondary winding of said drive transformer.

19. The power supply as recited in claim 15 further comprising a diode and a resistor coupled in parallel to affect a turn-on and turn-off of said power switch.

20. The power supply as recited in claim 15 further comprising a diode and a resistor coupled in parallel to affect a turn-on and turn-off of said controllable switch.

* * * * *